United States Patent [19]

Bell

[11] 4,268,911

[45] May 19, 1981

[54] ROM PROGRAM SECURITY CIRCUITS

[75] Inventor: Antony G. Bell, Sunnyvale, Calif.

[73] Assignee: Fairchild Camera and Instrument Corp., Mountain View, Calif.

[21] Appl. No.: 50,909

[22] Filed: Jun. 21, 1979

[51] Int. Cl.³ .................. G11C 17/00; G11C 11/40
[52] U.S. Cl. .................................. 365/104; 307/238.3
[58] Field of Search ...................... 365/103, 104, 105

[56] References Cited

U.S. PATENT DOCUMENTS

| 3,872,450 | 3/1975  | Reynolds         | 365/104 |
| 4,037,218 | 7/1977  | Gröeger et al.   | 365/104 |
| 4,064,493 | 12/1977 | Davis            | 365/104 |
| 4,084,105 | 4/1978  | Teranishi et al. | 365/104 |

Primary Examiner—Terrell W. Fears

Attorney, Agent, or Firm—Paul J. Winters; Ronald J. Meetin; Michael J. Pollock

[57] ABSTRACT

Read-only memories are manufactured to include the associated microprocessor controlling program specified by, and proprietary to, the manufacturer's customers. The problem the manufacturer has of identifying each ROM and associated microprocessor with each customer is now overcome by including an assigned customer identification number in a separate small permanent register that may be read out into the data bus by an appropriate input signal. Stored program security is provided by including in the ROM test circuit a fusible link that may be opened by an appropriate signal to prevent all future readout of the customer's proprietary program.

3 Claims, 2 Drawing Figures

ROM PROGRAM SECURITY CIRCUITS

BACKGROUND OF THE INVENTION

1. Field of the Invention

This invention relates to integrated circuits of the type known as microprocessors and more particularly to microprocessors containing as a part thereof a programmable read-only memory (ROM) suitable for storage of a program controlling the operation of the microprocessor.

2. Description of the Prior Art

Microprocessors are now well-known in the semiconductor industry. A typical microprocessing system is described in U.S. Pat. No. 3,984,813, issued Oct. 5, 1976 on an application of David H. Chung. The microprocessor shown and described in that patent comprises a minimum twochip system wherein one chip includes the central processing unit (CPU), a scratch pad RAM memory, an interrupt circuit and several input-output (I/O) ports. A second chip contains a program counter, a ROM circuit, an interrupt and additional I/O ports. In operation, the ROM circuit contains the program controlling the operation of the associated central processing unit. Information transmitted to the microprocessor is then processed in accordance with this program and output signals generated by the operation of the CPU are sent from the microprocessor to carry out selected tasks. The particular program contained in the ROM circuit is usually proprietary to the party using the microprocessor. However, because of the way in which microprocessors are manufactured, the ROM program must be placed in the ROM by the manufacturer of the microprocessor and not by the customer who develops the program. Accordingly, the customer is concerned that the program be held by the manufacturer in confidence and not be disclosed either directly or indirectly to third parties.

The manufacturer, on the other hand, is faced with a difficult logistics problem. Typically, a given type of microprocessor will be sold to many thousands of different customers, each with a different proprietary program to be manufactured into the ROM. The manufacturer must be able to determine which particular microprocessor chips have been programmed for specific customers and must develop procedures to ensure that a given customer receives only those microprocessor ROM chips containing that customer's program. Furthermore, each customer is also concerned that his own customers or the ultimate users of the microprocessor will not have access to the customer's proprietary program placed in the ROM chip by the manufacturer. By allowing the ultimate user of the microprocessor to have access to this code, the user could then seek bids from other manufacturers of microprocessors in an attempt to obtain the microprocessors from other sources.

Accordingly, a method is required to enable a manufacturer of microprocessors to specifically identify the particular ROM chips destined for particular customers in a unique and fail-safe manner and to allow the customer to prevent his customers, the ultimate users, from reading out the particular proprietary program generated for use in the microprocessor.

SUMMARY OF THE INVENTION

This invention overcomes the above problems of the prior art and provides a structure and method by which a manufacturer of microprocessors is able to simply and inexpensively ensure the proper identification of the ROM chips contained in the manufacturer's inventory for different customers. Furthermore, the invention also provides a convenient and economical method of both allowing the program placed in the ROM to be verified and authenticated and of preventing third parties from having access to this program.

Briefly described, the invention provides for a small permanent register which, when manufactured with the ROM containing the proprietary program of the customer, specifies an arbitrary customer identification number which may be read via the data bus by an appropriate control input signal. Once the proprietary program in the ROM has been verified and authenticated by application of appropriate input test signals, the customer may prevent all future readout of the ROM program by applying a test signal of opposite polarity which turns on a transistor that feeds a relatively large current through a fusible link in the test terminal circuit to thereby prevent all future testing and a divulgence of the customer's proprietary program. The invention therefore provides two forms of security: an identifying means for assuring that the manufactured ROM with the proprietary program is identified with the proper customer; and a means for preventing readout and disclosure of the proprietary ROM program.

DESCRIPTION OF THE DRAWINGS

In the figures which illustrate a preferred embodiment of the invention.

DESCRIPTION OF THE PREFERRED EMBODIMENTS

The security circuits of the invention may be manufactured with virtually any ROM and associated microprocessor and is particularly adaptable to the F3870 single chip microcomputer manufactured by Fairchild Camera and Instrument Corporation, Mountain View, Calif. The F3870 is a microprocessor containing, on a single chip, both the CPU and the ROM containing the program for the central processing unit.

Manufacturers of microcomputers with associated read-only memory circuits construct these memories to include a specific proprietary program specified by the manufacturer's customer. Each customer desires the microprocessor for a different purpose or for a different system and it becomes a difficult logistics problem for the manufacturer, who may be manufacturing identical microprocessors with many thousands of differently programmed ROMs, to identify each microprocessor with a specific customer. The solution therefore is to implant a customer identification number in a small permanent register designed in the chip so that any microprocessor, which during various manufacturing steps will contain no exterior identification, may be identified with the proper customer.

Many microprocessors, such as the aforementioned F3870, include an external "TEST" pin on the chip. When suitable voltage is applied to this TEST pin, one of the I/O ports becomes an output of the internal data bus so that all data activity within the chip may be monitored and ROM programs may be verified.

Figure 1:
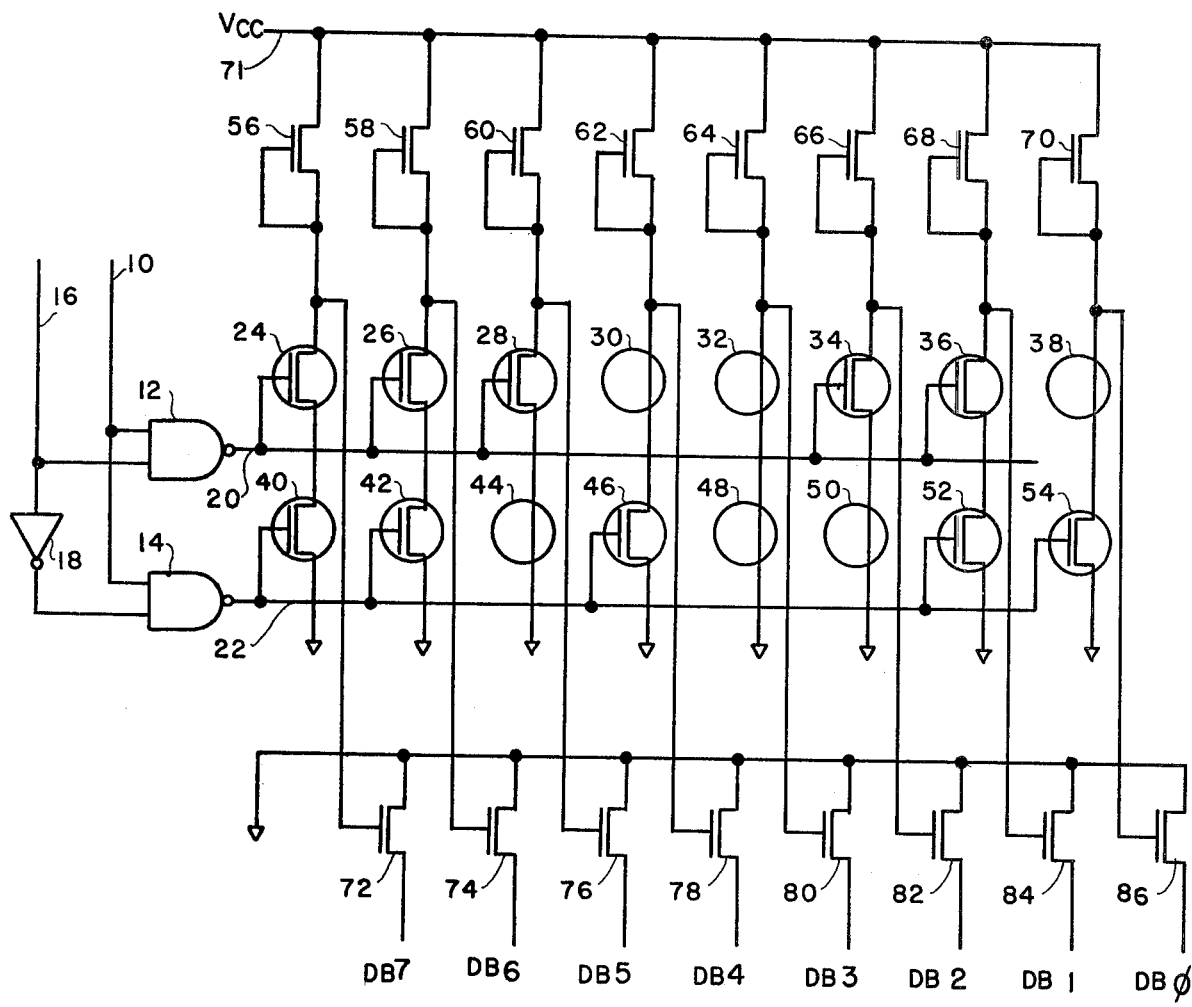
FIG. 1 is a circuit diagram illustrating circuitry by which a ROM chip may be uniquely identified with a customer.

Illustrated in FIG. 1 is a circuit diagram of a customer identification (ID) register containing a special sixteen-bit code assigned to each customer. During the placement of the code in the ROM, typically by controlling the configuration of a metallization mask during the manufacturing of the ROM, the code unique to the customer developing the program is placed in the customer ID register so that the manufacturer can properly identify the customer. By using sixteen bits, $2^{16}$, or 65,536 different customers may be uniquely identified by the code of the invention.

In the preferred embodiment illustrated in FIG. 1, a positive D.C. signal such as received from the "TEST" pin is applied to an input conductor 10 and provides one of two inputs to NAND gates 12 and 14. A second input signal, such as may be derived from an instruction register bit, is received on conductor 16 and provides the second input to NAND gate 12. The signal is inverted by the inverter 18 and applied as the second input to NAND gate 14. The output of NAND gate 12 will be designated as control line 20 and the output of NAND gate 14 will be designated as control line 22. As long as the input on conductor 10 is at a low state, the output signals on control lines 20 and 22 will always be high. However, when an input voltage is applied to conductor 10, a high level input on conductor 16 will produce a low level on control line 20 and a high level on control line 22; a low input on conductor 16 will produce a high level on conductor 20 and a low level on conductor 22.

Associated with the control line 20 is a row of enhancement transistor locations 24, 26, 28, 30, 32, 34, 36, and 38 and associated with the control line 22 is a similar row of eight enhancement transistor locations 40, 42, 44, 46, 48, 50, 52, and 54 corresponding, respectively, on a one-to-one basis to transistors 24-38. Each of the transistor locations is designated by a circle which may, or may not contain an enhancement transistor, depending upon the particular identification code to be implanted. Associated with control line 20 are enhancement transistors at locations 24, 26, 28, 34 and 36. Locations 30, 32 and 38 are illustrated without transistors and may either be heavily implanted transistors that are not affected by variations in control line voltage and therefore remain conductive, or may actually be omitted in the manufacturing process. The presence or absence of transistors in the locations 24-38 associated with control line 20 designates the binary number "11100110" that is applied to the data bus as will be subsequently explained. This number represents an ID or identification number of a particular customer and may be used together with the binary code associated with control line 22 (11010011) to designate one of 65,536 different customers.

Control line 20 is coupled to the gate of each transistor implanted in locations 24-38 and control line 22 is coupled to the gates of those transistors in locations 40-54. The source element of each transistor in locations 40-54 is connected to ground and the drain element is connected to the source of the corresponding transistor in locations 24-38. If a transistor is absent or heavily implanted so that it is not affected by control line voltage, such as the location 44, the schematic of FIG. 1 illustrates that the ground connection is coupled directly to the source of transistor 28 in the same vertical column.

The drain elements of all transistors at locations 24-38 are coupled individually to the source elements of transistors 56, 58, 60, 62, 64, 66, 68, and 70, respectively. The drain elements of transistors 56-70 are each coupled to a conductor 71 to which is connected a $V_{cc}$ voltage source and the gate elements of transistors 56-70 are coupled to their source elements. Transistors 56-70 are heavy depletion load transistors and are therefore always on but act as series resistances between the $V_{cc}$ conductor 71 and the drain electrodes of the coded transistor array contained in the locations 24-54.

The source elements of heavy depletion load transistors 56-70 are coupled individually to the gate electrodes of enhancement transistors 72, 74, 76, 78, 80, 82, 84, and 86, respectively, the drain elements of which are coupled together and to ground potential and the source elements of which are connected to the microprocessor or ROM data bus designated herein by data bus lines DB7, DB6, DB5, DB4, DB3, DB2, DB1, and DB0, respectively.

As previously mentioned, with no input signals on conductors 10 or 16, the voltage levels on control lines 20 and 22 are high so that all enhancement transistors implanted in locations $24 \geq 54$ are rendered conductive to thereby ground the source elements of the transistors 56-70 to turn off all transistors 72-86 to thereby isolate the data bus from ground. When the manufacturer desires to interrogate the register to determine the customer's ID number, a voltage is first applied to conductors 10 and 16 to produce a low output on control line 20 thereby isolating the source elements of transistors 56-70 from ground and applying a positive voltage to the gate electrodes of the data bus switching transistors 72-86. Immediately thereafter, the voltage on input conductor 16 is pulsed from its high to its low state so that the voltage level on control line 20 goes high and the voltage on control line 22 goes low. Therefore, the transistors in locations 40-54 associated with the control line 22 are rendered non-conductive to raise the voltage level on the source electrodes of transistors 56-70 so that a second group of eight bits is put on the data bus. The manufacturer therefore is able to distinguish each of the chips coded with the customer's ID number and to assure that chips containing a proprietary ROM program of one customer are not mistakenly labeled and delivered to another customer.

Figure 2:
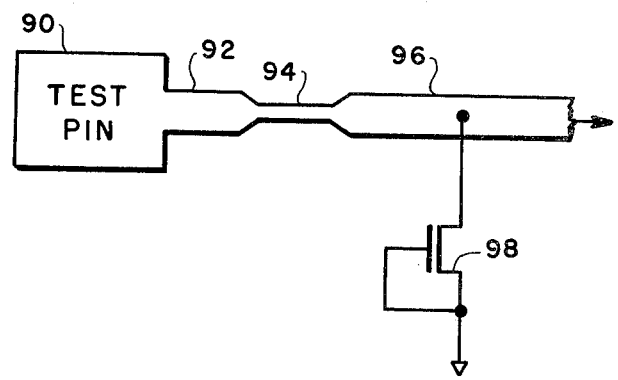
FIG. 2 is a schematic drawing of structure and circuitry for preventing the unauthorized reading of the program contained in the ROM chip.

As previously mentioned, some microcomputers, such as the aforementioned F3870, have test pins to which may be applied a voltage for reading the contents of the data bus. When the chip is properly identified as described above and delivered to the customer, the customer may, if desired, apply a test signal to the test pin and read the data bus including the program manufactured into the ROM. This is important for a verification that the program has been properly applied by the manufacturer. Further, because programs are costly to develop and are generally proprietary to the customer, it is apparent that the customer would desire that the program, once authenticated and verified, could no longer be determined by competitors or end users. The very simple circuit illustrated in FIG. 2 illustrates a means by which the program may be held in secret after verification.

The test voltage applied to a test pin for reading the contents of the data bus within the microprocessor may be required to apply as much as six volts to various circuit components but at a negligible current. Therefore, the printed circuit conductor required to carry the negligible current may be very narrow and will easily be conducted through an extra narrow fusible link section 94 without possibility of heating the fusible link.

Coupled to the section of conductor 96 that leads to the test circuitry and located on the side of the fusible link 94 opposite test pin 90 is a relatively large enhancement transistor 98 coupled between conductor 96 and ground. The gate of transistor 98 is coupled to its source element and to ground whereas the drain electrode is connected to the conductor 96. Transistor 98 is therefore normally off and will not conduct while the positive voltage is applied to the test pin 90 for actuation of test circuitry associated with the readout of the data bus and authentication of a customer's ROM code. To prevent further readout of the data bus and ROM code, it is only necessary to apply a negative voltage to the test pin 90. This voltage must be at a level above the threshold voltage level of transistor 98, at which point the transistor will conduct heavily and the resulting current flow through the conductor 96, 94 and 92 will destroy (or melt) the fusible link 94, thereby disconnecting the test pin 90 from the test circuitry and assuring the customer that his proprietary ROM program may not be discovered. Typically fusible link 94 is formed of aluminum (other conductors, whether metals or polycrystalline silicon can also be used) and the fuse portion has a cross-section of about six square microns. A current of about 140 milliamperes is normally sufficient to blow the fuse.

Having thus described my invention, what is claimed is:

1. A program security circuit for a read-only memory contained in a memory chip having a test pin for testing and verifying a selected program stored in the memory, the memory chip having a memory data bus and a memory read circuit conductor, the security circuit comprising:
   a permanent register formed in the memory chip for identifying the selected program and thereby identifying the memory chip, the permanent register containing a selected binary identifying number placeable into the memory data bus upon application of a suitable input signal to the permanent register;
   a conductive fusible link between the test pin and the memory read circuit conductor;
   an enhancement transistor having its drain coupled to the memory read circuit conductor and having its source and gate coupled to each other and to ground reference; and
   means for applying to the test pin a negative voltage whose magnitude exceeds the magnitude of the threshold voltage of the transistor, whereby the transistor conducts a fusing current through the fusible link to destroy the fusible link and thereby permanently remove access to the program through the test pin.

2. A program security circuit as in claim 1 wherein the permanent register comprises a plurality of transistor locations arranged in a matrix of at least one row and at least two columns, each column positioned between ground reference and a positive voltage source, the identifying number defined by normally conductive transistors formed in selected ones of the transistor locations and normally non-conductive transistors implanted in the remaining ones of the transistor locations.

3. A program security circuit as in claim 2 wherein an output signal for each column is taken at node between the at least one transistor location of that column and a resistive element coupled to the voltage source, each output signal providing a gating signal to the memory data bus.

* * * * *